United States Patent
Zhang et al.

(10) Patent No.: US 9,484,085 B1
(45) Date of Patent: Nov. 1, 2016

(54) STATIC MEMORY APPARATUS AND STATIC MEMORY CELL THEREOF

(71) Applicants: Faraday Technology Corporation, Suzhou (CN); Faraday Technology Corp., Hsinchu (TW)

(72) Inventors: Zhao-Yong Zhang, Suzhou (CN); Kun-Ti Lee, Hsinchu (TW)

(73) Assignees: FARADAY TECHNOLOGY CORPORATION, Suzhou, Jiangsu Province (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/098,329

(22) Filed: Apr. 14, 2016

(30) Foreign Application Priority Data

Mar. 3, 2016 (CN) .......................... 2016 1 0120688

(51) Int. Cl.
  *G11C 11/00* (2006.01)
  *G11C 11/419* (2006.01)
  *G11C 11/412* (2006.01)

(52) U.S. Cl.
  CPC ............ *G11C 11/419* (2013.01); *G11C 11/412* (2013.01)

(58) Field of Classification Search
  CPC . G11C 7/1051; G11C 11/4096; G11C 7/106; G11C 7/1078
  See application file for complete search history.

(56) References Cited

U.S. PATENT DOCUMENTS

| 5,521,878 A | * | 5/1996 | Ohtani | G11C 7/103 365/189.05 |
| 6,172,918 B1 | * | 1/2001 | Hidaka | G11C 7/1012 365/189.05 |
| 7,355,906 B2 | | 4/2008 | Joshi et al. | |
| 8,339,838 B2 | | 12/2012 | Ramaraju | |
| 9,368,208 B1 | * | 6/2016 | Marshall | G11C 14/0081 |

\* cited by examiner

*Primary Examiner* — Tuan T Nguyen
(74) *Attorney, Agent, or Firm* — Winston Hsu; Scott Margo (57) ABSTRACT

A static memory apparatus and a static memory cell thereof are provided. The static memory cell includes a data latch circuit, a data write-in circuit and a data read-out circuit. The data latch circuit has a first tristate output inverting circuit and a second tristate output inverting circuit. The data write-in circuit provides a first reference voltage to a power receiving terminal of a selected tristate output inverting circuit which is one of the first and second tristate output inverting circuits, and provides a second reference voltage to an input terminal of the selected tristate output inverting circuit during a data write-in time period. The data read-out circuit generates read-out data according to a voltage at an output terminal of the second tristate output inverting circuit and the second reference voltage during a data read-out time period.

12 Claims, 4 Drawing Sheets

STATIC MEMORY APPARATUS AND STATIC MEMORY CELL THEREOF

CROSS-REFERENCE TO RELATED APPLICATION

This application claims the priority benefit of China application serial no. 201610120688.6, filed on Mar. 3, 2016. The entirety of the above-mentioned patent application is hereby incorporated by reference herein and made a part of this specification.

BACKGROUND OF THE INVENTION

1. Field of the Invention

The invention relates to a static memory cell, and more particularly, to a static memory cell capable of eliminating write-in interference.

2. Description of Related Art

With advancements in semiconductor technology, consumer electronics products have become a necessary tool in daily lives. Memory apparatuses, such as static random access memories, played an important role among the electronics products.

Today, as the minimum size in the manufacturing process gradually reduced with the increasingly sophisticated semiconductor processing technology, restrictions have become more stringent for the static random access memories in terms of write margin and minimum operating voltage. Therefore, during accessing operations for data writing or reading of the static memory cells in the static random access memory, the half-selected static memory cells are prone to electrical leakage due to the read/write interference phenomenon, which then leads to possible occurrence of data loss. Accordingly, it has become an important issue to be solved for person skilled in the art as how to design a static memory cell which can be stably accessed.

SUMMARY OF THE INVENTION

The invention is directed to a static memory apparatus and a static memory cell thereof capable of effectively solving the read/write interference phenomenon occurred during reading/writing operations.

A static memory cell of the invention includes a data latch circuit, a data write-in circuit and a data read-out circuit. The data latch circuit has a first tristate output inverting circuit and a second tristate output inverting circuit. An input terminal of the first tristate output inverting circuit is coupled to an output terminal of the second tristate output inverting circuit. An output terminal of the first tristate output inverting circuit is coupled to an input terminal of the second tristate output inverting circuit. The data write-in circuit is coupled to the data latch circuit, provides a first reference voltage to a power receiving terminal of a selected tristate output inverting circuit which is one of the first and second tristate output inverting circuits, and provides a second reference voltage to an input terminal of the selected tristate output inverting circuit during a data write-in time period. The data read-out circuit is coupled to the output terminal of the second tristate output inverting circuit and generates read-out data according to a voltage at the output terminal of the second tristate output inverting circuit and the second reference voltage during a data read-out time period.

A static memory apparatus of the invention includes a plurality of first write-in bit lines, a plurality of second write-in bit lines, a plurality of write-in word lines and a plurality of static memory cells. The first write-in bit lines transmit a plurality of first write-in bit signals respectively. The second write-in bit lines transmit a plurality of second write-in bit signals respectively. The write-in word lines transmit a plurality of write-in word line signals respectively. The static memory cells are arranged in a memory cell array. The memory cell array has a plurality of static memory cell rows and a plurality of static memory cell columns. The first write-in bit lines and the second write-in bit lines are disposed respectively in correspondence to the static memory cell rows. The write-in word lines are disposed respectively in correspondence to the static memory cell columns. Each of the static memory cells includes a data latch circuit, a data write-in circuit and a data read-out circuit. The data latch circuit has a first tristate output inverting circuit and a second tristate output inverting circuit. An input terminal of the first tristate output inverting circuit is coupled to an output terminal of the second tristate output inverting circuit. An output terminal of the first tristate output inverting circuit is coupled to an input terminal of the second tristate output inverting circuit. The data write-in circuit is coupled to the data latch circuit and coupled to the corresponding first and second write-in bit lines and the write-in word line, provides a first reference voltage to a power receiving terminal of a selected tristate output inverting circuit which is one of the first and second tristate output inverting circuits, and provides a second reference voltage to an input terminal of the selected tristate output inverting circuit during a data write-in time period. The data read-out circuit is coupled to the output terminal of the second tristate output inverting circuit and generates read-out data according to a voltage at the output terminal of the second tristate output inverting circuit and the second reference voltage during a data read-out time period.

Based on the above, in the invention, the data write-in circuit is utilized to provide the first reference voltage to serve as the operating power of the selected tristate output inverting circuit which is one of the two tristate output inverting circuit and cut off the path of another one of the two tristate output inverting circuits for receiving the operating power during the data write-in time period. Further, the data write-in circuit provides the second reference voltage to the input terminal of the selected tristate output inverting circuit in order to complete the write-in operation of the write-in data. According to the above, the non-selected tristate output inverting circuit which may influence the write-in operation of the write-in data is disabled while the write-in data is written into the data latch circuit. As a result, the write-in operation of the write-in data can be effectively completed and the write-in interference phenomenon may be effectively eliminated.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
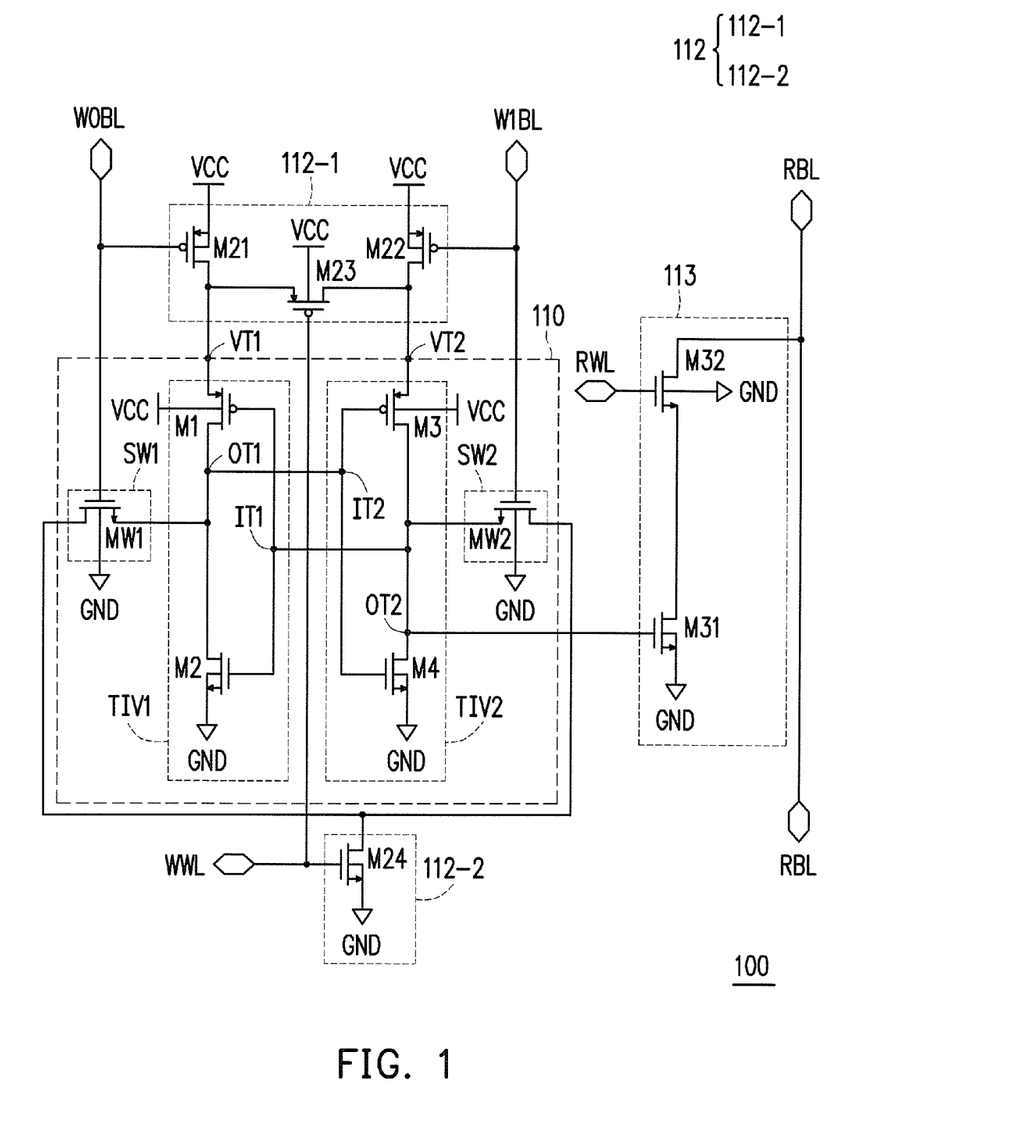
FIG. 1 illustrates a circuit diagram of a static memory cell in an embodiment of the invention.

Referring to FIG. 1, FIG. 1 illustrates a circuit diagram of a static memory cell in an embodiment of the invention. A static memory cell 100 includes a data latch circuit 110, a data write-in circuit 112 and a data read-out circuit 113. The data write-in circuit 112 is constituted by circuits 112-1 and 112-2. The data latch circuit 110 includes a first tristate output inverting circuit TIV1 constituted by transistors M1 and M2 and a second tristate output inverting circuit TIV2 constituted by transistors M3 and M4. An input terminal IT1 of the first tristate output inverting circuit TIV1 is coupled to an output terminal OT2 of the second tristate output inverting circuit TIV2. An output terminal OT1 of the first tristate output inverting circuit TIV1 is coupled to an input terminal IT2 of the second tristate output inverting circuit TIV2. Herein, the first tristate output inverting circuit TIV1 has a power receiving terminal VT1; the second tristate output inverting circuit TIV2 has a power receiving terminal VT2. In addition, the data latch circuit 110 also includes a data write-in switch SW1 constituted by a transistor MW1 and a data write-in switch SW2 constituted by a transistor MW2. The data write-in switch SW1 is coupled between the input terminal IT2 of the second tristate output inverting circuit TIV2 and the circuit 112-2, and is turned on or off according to a first write-in bit signal W0BL. Further, the data write-in switch SW2 is coupled between the input terminal IT1 of the first tristate output inverting circuit TIV1 and the circuit 112-2, and is turned on or off according to a second write-in bit signal W1BL.

In the data write-in circuit 112, the circuit 112-1 includes first, second and third switches which are constituted by transistors M21, M22 and M23 respectively. Herein, a first terminal of the transistor M21 receives a reference voltage VCC. A second terminal of the transistor M21 is coupled to the power receiving ten final VT1 of the first tristate output inverting circuit TIV1. A control terminal of the transistor M21 receives the first write-in bit signal W0BL. The transistor M21 is turned on or off according to the first write-in bit signal W0BL. A first terminal of the transistor M22 also receives the reference voltage VCC. A second terminal of the transistor M22 is coupled to the power receiving terminal VT2 of the second tristate output inverting circuit TIV2. A control terminal of the transistor M22 receives the second write-in bit signal W1BL. The transistor M22 is turned on or off according to the second write-in bit signal W1BL. It is worth mentioning that in the present embodiment, the first and second write-in bit signals W0BL and W1BL are complementary during a data write-in time period. In other words, during a data write-in operation performed by the static memory cell 100, one of the transistors M21 and M22 is turned on while another one is turned off. Meanwhile, one of the data write-in switches SW1 and SW2 is turned on while another one is turned off.

The switch formed by the transistor M23 has a terminal coupled to the power receiving terminal VT1, another terminal coupled to the power receiving terminal VT2, and a control terminal receiving a write-in word line signal WWL to be turned on or off. Here, it is worth mentioning that, when the static memory cell 100 is in the data write-in time period, the transistor M23 is turned off according to the write-in word line signal WWL. Conversely, when the static memory cell 100 is in a non data write-in time period, the transistor M23 is turned on according to the write-in word line signal WWL.

On the other hand, the circuit 112-2 includes a switch constituted by a transistor M24. A terminal of the transistor M24 is coupled to the data write-in switch SW1 and the data write-in switch SW2, and another terminal of the transistor M24 receives a reference voltage GND. Further, a control terminal of the transistor M24 receives the write-in word line signal WWL and is turned on or off according to the write-in word line signal WWL. It is worth mentioning that, the on/off state of the transistor M24 is complementary to the on/off state of the transistor M23.

The data read-out circuit 113 is constituted by including a switch formed by transistors M31 and M32. Herein, a first terminal of the transistor M31 receives the reference voltage GND. A second terminal of the transistor M31 is coupled to a first terminal of the transistor M32. The transistor M31 is turned on or off according to a voltage at the output terminal OT2 of the second tristate output inverting circuit TIV2. Further, the transistor M32 is also coupled to a read bit line RBL and is turned on or off according to a read word line signal RWL. When the transistor M32 is turned on according to the read word line signal RWL, the transistors M31 and M32 can provide read-out data to the read bit line RBL according to the voltage at the output terminal OT2 of the second tristate output inverting circuit TIV2.

Details regarding operations of the static memory cell 100 are provided as follows. When the static memory cell 100 is in a standby state, the data write-in switches SW1 and SW2 are turned off respectively according to the first and second write-in bit signals W0BL and W1BL (the first and second write-in bit signals W0BL and W1BL are maintained with the same ground voltage values at the time). Further, the transistors M21 and M22 are turned on respectively according to the first and second write-in bit signals W0BL and W1BL; the transistor M23 is turned on according to the write-in word line signal WWL; the transistor M24 is turned off according to the write-in word line signal WWL. At this time, the reference voltage VCC is received by the power receiving terminals VT1 and VT2 of the first and second tristate output inverting circuits TIV1 and TIV2 through the turned on transistors M21 and M22 to serve as an operating power and maintain a latch-up state of data in the first and second tristate output inverting circuits TIV1 and TIV2. In addition, the read word line signal RWL turns off the transistor M32 at the time, so that the data read-out circuit 113 does not generate the read-out data to the read bit line RBL.

Further, when the static memory cell 100 is in a data read-out time period, the read bit line RBL may be pre-charged to be equal to the reference voltage VCC; the data write-in switches SW1 and SW2 and the transistor M24 are maintained at the off state; the transistors M21, M22 and M23 are maintained at the on state. Further, the read word line signal RWL turns on the transistor M32 at the time. In this case, if the transistor M31 is turned on according to the voltage at the output terminal OT2 of the second tristate output inverting circuit TIV2, the reference voltage GND may be provided to the read bit line RBL through the turned on transistors M31 and M32 to serve as the read-out data. Conversely, if the transistor M31 is turned off according to the voltage at the output terminal OT2 of the second tristate output inverting circuit TIV2, the voltage maintained equal to the reference voltage VCC on the read bit line RBL may be provided to serve as the read-out data.

Subsequently, during the data write-in time period, voltage levels of the first and second write-in bit signals W0BL and W1BL may be determined according to write-in data, where the first and second write-in bit signals W0BL and W1BL are complementary to each other. For instance, when the write-in data is logic "1", the first and second write-in bit signals W0BL and W1BL may be logic "0" and "1" respectively; when the write-in data is logic "0", the first and second write-in bit signals W0BL and W1BL may be logic "1" and "0" respectively.

Accordingly, when the first and second write-in bit signals W0BL and W1BL are logic "1" and "0" respectively, the transistor M21 and the data write-in switch SW2 are turned off and the transistor M22 and the data write-in switch SW1 are turned on. Meanwhile, the write-in word line signal WWL turns off the transistor M23 and turns on the transistor M24. At this time, the reference voltage GND is transmitted to the input terminal IT2 of the second tristate output inverting circuit TIV2 through the turned on transistor M24 and the data write-in switch SW1. In the case where the second tristate output inverting circuit TIV2 can receive the reference voltage VCC through the transistor M22 and the first tristate output inverting circuit TIV1 does not receive the reference voltage VCC served as the operating power, the reference voltage GND equal to the write-in data (equal to logic "0") may be successfully written into the second tristate output inverting circuit TIV2 in the data latch circuit 110. Accordingly, the write-in operation of the write-in data "0" may then be realized.

On the other hand, when the first and second write-in bit signals W0BL and W1BL are logic "0" and "1" respectively, the transistor M22 and the data write-in switch SW1 are turned off and the transistor M21 and the data write-in switch SW2 are turned on. Meanwhile, the write-in word line signal WWL turns off the transistor M23 and turns on the transistor M24. At this time, the reference voltage GND is transmitted to the input terminal IT1 of the first tristate output inverting circuit TIV1 through the turned on transistor M24 and the data write-in switch SW2. In the case where the first tristate output inverting circuit TIV1 can receive the reference voltage VCC through the transistor M21 and the second tristate output inverting circuit TIV2 does not receive the reference voltage VCC served as the operating power, the reference voltage GND equal to the write-in data (equal to logic "0") may be successfully written into the first tristate output inverting circuit TIV1 in the data latch circuit 110. Accordingly, the write-in operation of the write-in data "1" may then be realized.

In view of the above description, in the present embodiment of the invention, the reference voltage GND is written into the second tristate output inverting circuit TIV2 or the first tristate output inverting circuit TIV1 through the data write-in switches SW1 or SW2, so as to complete the write-in operation of the write-in data "0" or "1". Further, when the write-in data is written into one of the first tristate output inverting circuit TIV1 and the second tristate output inverting circuit TIV2, the data write-in circuit 112 can cut off a path of another one of the first tristate output inverting circuit TIV1 and the second tristate output inverting circuit TIV2 for receiving the operating power. As such, the data write-in operation may be successfully completed and the write margin may be effectively improved.

Incidentally, in the present embodiment, the transistors M1, M3, M21, M22 and M23 are the P-type transistor, whereas the transistors M2, M4, MW1, MW2, M24, M32 and M31 may be the N-type transistor. The reference voltage GND may be a ground voltage, and the reference voltage VCC may be an operating power.

Figure 2:
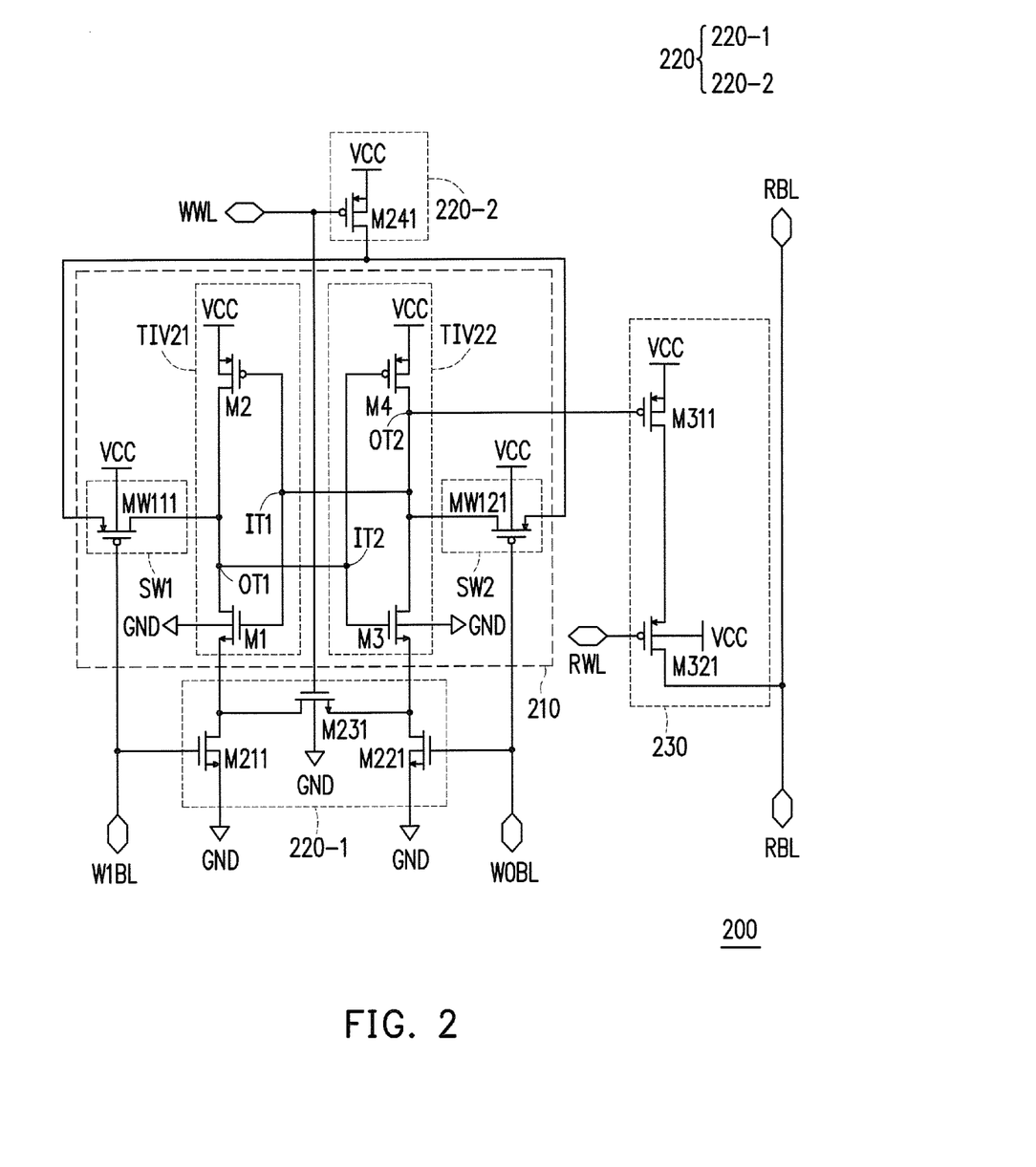
FIG. 2 illustrates a circuit diagram of a static memory cell in another embodiment of the invention.

Hereinafter, referring to FIG. 2, FIG. 2 illustrates a circuit diagram of a static memory cell in another embodiment of the invention. A static memory cell 200 in FIG. 2 is a complementary implementation of the static memory cell 100 in FIG. 1. Herein, the static memory cell 200 includes a data latch circuit 210, a data write-in circuit 220 and a data read-out circuit 230. The data write-in circuit 220 is constituted by circuits 220-1 and 220-2. In the present embodiment, the circuit 220-1 is coupled between a reference voltage GND (equal to a ground voltage) and the data latch circuit 210, and configured to provide the reference voltage GND to at least one of first and second tristate output inverting circuits TIV21 and TIV22 in the data latch circuit 210. Herein, the first tristate output inverting circuit TIV21 is constituted by transistors M1 and M2, and the second tristate output inverting circuit TIV22 is constituted by transistors M3 and M4. In the circuit 220-1, transistors M211, M221 and M231 served as switches may be the N-type transistor. Also, in the present embodiment, the transistors M1 and M3 are the N-type transistor, and the transistors M2 and M4 are the P-type transistor.

On the other hand, the circuit 220-2 includes a switch constituted by a transistor M241. The transistor M241 receives a reference voltage VCC and is configured to provide the reference voltage VCC to transistors MW111 and MW121 served as data write-in switches.

The data read-out circuit 230 is constituted by including a switch formed by transistors M311 and M321. Herein, the transistors M311 and M321 are the P-type transistor. Herein, a first terminal of the transistor M311 receives the reference voltage VCC. A second terminal of the transistor M311 is coupled to a first terminal of the transistor M321. The transistor M311 is turned on or off according to a voltage at an output terminal OT2 of the second tristate output inverting circuit TIV22. Further, the transistor M321 is also coupled to a read bit line RBL and is turned on or off according to a read word line signal RWL. When the transistor M321 is turned on according to the read word line signal RWL, the transistors M311 and M321 can provide read-out data to the read bit line RBL according to the voltage at the output terminal OT2 of the second tristate output inverting circuit TIV22.

Details regarding operations of the static memory cell 200 of the present embodiment are provided as follows. When the static memory cell 200 is in a standby state, data write-in switches SW1 and SW2 are turned off respectively according to first and second write-in bit signals W1BL and W0BL (the first and second write-in bit signals W1BL and W0BL are maintained with the same power voltage at the time). Further, the transistors M211 and M221 are turned on respectively according to the first and second write-in bit signals W1BL and W0BL. The transistor M231 is turned on according to a write-in word line signal WWL. The transistor M241 is turned off according to the write-in word line signal WWL. At this time, the first and second tristate output inverting circuits TIV21 and TIV22 are coupled to the reference voltage GND (the ground voltage) through the turned on transistors M211 and M221 to maintain a latch-up state of data in the first and second tristate output inverting circuits TIV21 and TIV22. In addition, the read word line signal RWL turns off the transistor M321 at the time, so that the data read-out circuit 230 does not generate the read-out data to the read bit line RBL.

Further, when the static memory cell 200 is in a data read-out time period, the read bit line RBL may be pre-charged to be equal to the reference voltage GND; the data write-in switches SW1 and SW2 and the transistor M241 are maintained at the off state; the transistors M211, M221 and M231 are maintained at the on state. Further, the read word line signal RWL turns on the transistor M321 at the time. In this case, if the transistor M311 is turned on according to the voltage at the output terminal OT2 of the second tristate output inverting circuit TIV22, the reference voltage VCC may be provided to the read bit line RBL through the turned on transistors M311 and M321 to serve as the read-out data. Conversely, if the transistor M311 is turned off according to the voltage at the output terminal OT2 of the second tristate output inverting circuit TIV22, the voltage maintained equal to the reference voltage GND on the read bit line RBL may be provided to serve as the read-out data.

Subsequently, during the data write-in time period, voltage levels of the first and second write-in bit signals W1BL and W0BL may be determined according to write-in data, where the first and second write-in bit signals W1BL and W0BL are complementary to each other. For instance, when the write-in data is logic "1", the first and second write-in bit signals W1BL and W0BL may be logic "0" and "1" respectively; when the write-in data is logic "0", the first and second write-in bit signals W1BL and W0BL may be logic "1" and "0" respectively.

Accordingly, when the first and second write-in bit signals W1BL and W0BL are logic "1" and "0" respectively, the transistor M211 and the data write-in switch SW2 are turned on and the transistor M221 and the data write-in switch SW1 are turned off. Meanwhile, the write-in word line signal WWL turns off the transistor M231 and turns on the transistor M241. At this time, the reference voltage VCC is transmitted to the input terminal IT1 of the first tristate output inverting circuit TIV21 through the turned on transistor M241 and the data write-in switch SW2. In the case where the first tristate output inverting circuit TIV21 can receive the reference voltage GND through the transistor M211 and the second tristate output inverting circuit TIV22 does not receive the reference voltage GND served as the ground power, the reference voltage VCC equal to the write-in data (equal to logic "1") may be successfully written into the first tristate output inverting circuit TIV21 in the data latch circuit 210. Accordingly, the write-in operation of the write-in data "0" may then be realized.

On the other hand, when the first and second write-in bit signals W1BL and W0BL are logic "0" and "1" respectively, the transistor M221 and the data write-in switch SW1 are turned on and the transistor M211 and the data write-in switch SW2 are turned off. Meanwhile, the write-in word line signal WWL turns off the transistor M231 and turns on the transistor M241. At this time, the reference voltage VCC is transmitted to the input terminal IT2 of the second tristate output inverting circuit TIV22 through the turned on transistor M241 and the data write-in switch SW1. In the case where the first tristate output inverting circuit TIV21 can receive the reference voltage GND through the transistor M211 and the second tristate output inverting circuit TIV22 does not receive the reference voltage GND served as the ground power, the reference voltage VCC equal to the write-in data (equal to logic "1") may be successfully written into the second tristate output inverting circuit TIV22 in the data latch circuit 210. Accordingly, the write-in operation of the write-in data "1" may then be realized.

Figure 3:
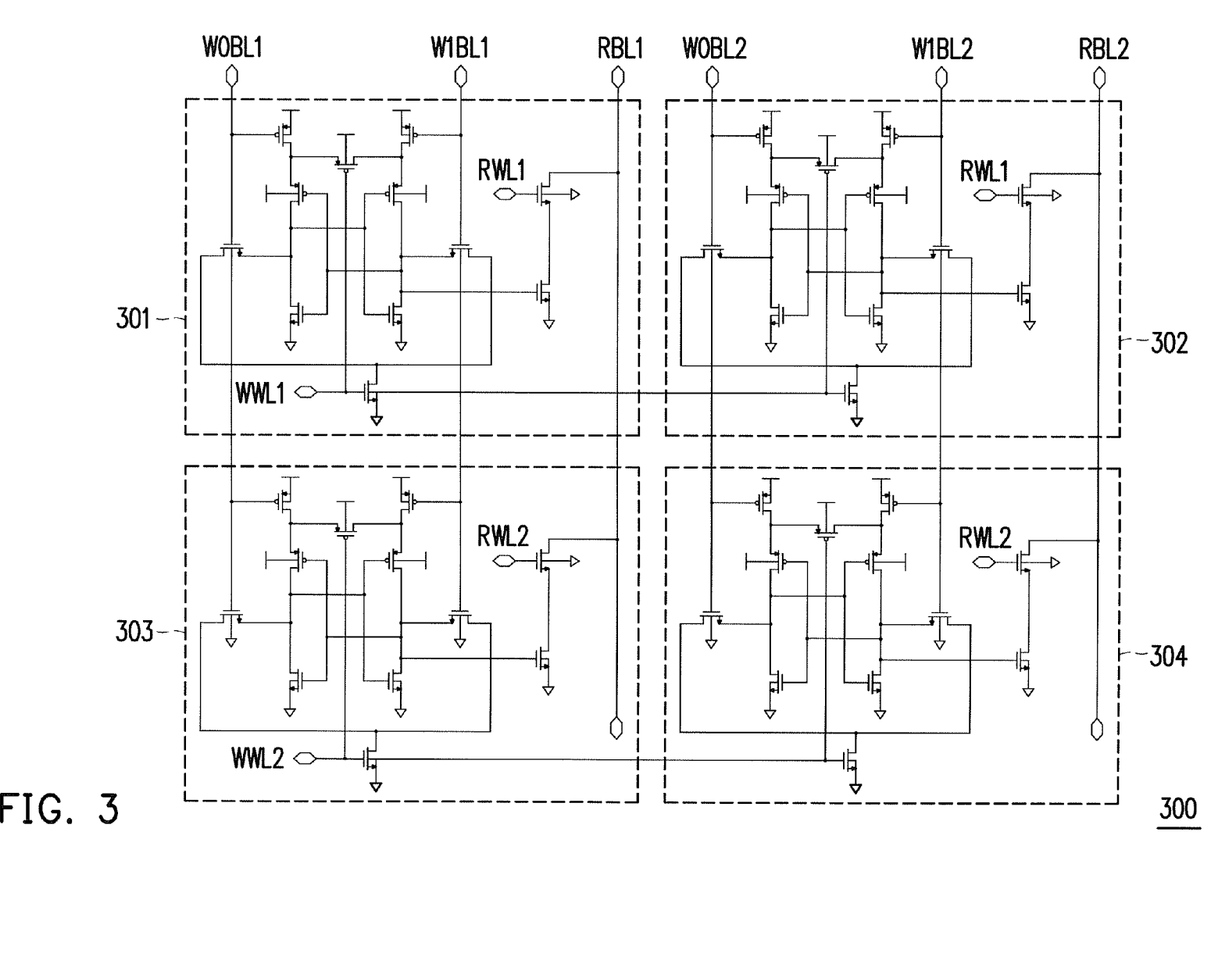
FIG. 3 illustrates a schematic diagram of a static memory apparatus in an embodiment of the invention.

Hereinafter, referring to FIG. 3, FIG. 3 illustrates a schematic diagram of a static memory apparatus in an embodiment of the invention. A static memory apparatus 300 includes a plurality of first write-in bit lines W0BL1 and W0BL2, a plurality of second write-in bit lines W1BL1 and W1BL2, a plurality of write-in word lines WWL1 and WWL2 and a plurality of static memory cells 301 to 304. The static memory cells 301 to 304 may be the static memory cells 100 or 200 as mentioned in the embodiments of the invention.

In the present embodiment, the static memory cells 301 to 304 are arranged in a memory cell array. The static memory cells 301 and 302 form a static memory cell column, and the static memory cells 303 and 304 form another static memory cell column. The static memory cells 301 and 303 can form a static memory cell row, and the static memory cells 302 and 304 can form another static memory cell row.

The static memory cells 301 and 302 of the same static memory cell column receive the same read word line signal RWL1; the static memory cells 303 and 304 of the same static memory cell column receive the same read word line signal RWL2. Further, the static memory cells 301 and 303 of the same static memory cell row are connected to the same read bit line RBL1; the static memory cells 302 and 304 of the same static memory cell row are connected to the same read bit line RBL2.

In the present embodiment, the first write-in bit lines W0BL1 and W0BL2 and the second writes-in bit lines W1BL1 and W1BL2 are disposed respectively along an extending direction of each of the static memory cell rows, whereas the write-in word lines WWL1 and WWL2 are disposed respectively along an extending direction of each of the static memory cell columns. Herein, the first write-in bit line W0BL1 and the second write-in bit line W1BL1 are coupled to the static memory cells 301 and 303; the first write-in bit line W0BL2 and the second write-in bit line W1BL2 are coupled to the static memory cells 302 and 304; the write-in word line WWL1 is coupled to the static memory cells 301 and 302; the write-in word line WWL2 is coupled to the static memory cells 303 and 304.

When the data write-in operation is performed for one of the memory cells 301 to 304 (e.g., when the data write-in operation of the write-in data "0" is to be executed for the static memory cell 302), the first and second write-in bit line signals on the first and second write-in bit lines W0BL1 and W1BL1 may both be set as logic "0"; the first and second write-in bit line signals on the first and second write-in bit lines W0BL2 and W1BL2 may be set as logic "1" and "0" respectively; the write-in word line signals on the write-in word lines WWL1 and WWL2 may be set as logic "1" and "0", respectively. Accordingly, despite the write-in word line signal on the write-in word line WWL1 equals to logic "1," because the first and second write-in bit lines W0BL and W1BL2 are equal to logic "0", the write-in data switch is turned off but the switch providing the power is stilled turned on so that the data in the static memory cell 301 in the half-selected can remain unchanged. In addition, the static memory cell 303 is in the standby state at the time, whereas the static memory cell 302 is selected for the data write-in operation.

Figure 4:
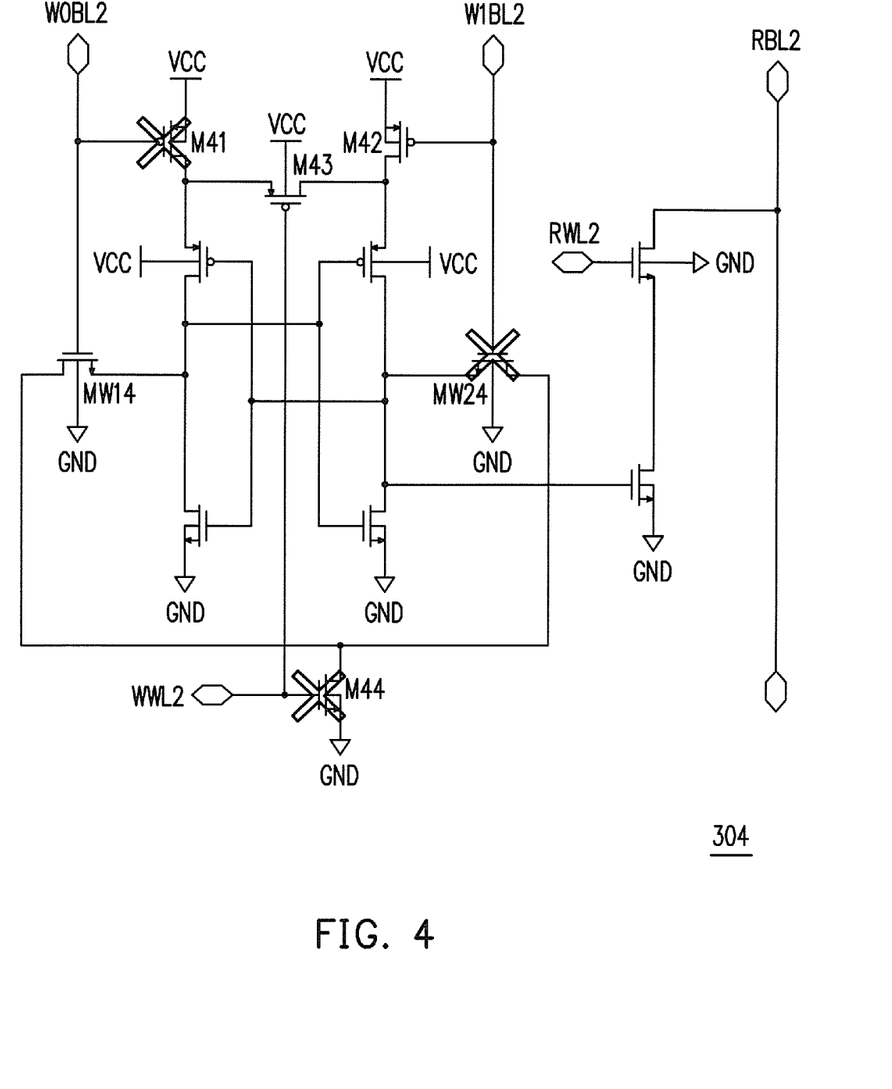
FIG. 4 is a schematic diagram illustrating operations of a half-selected static memory cell in an embodiment of the invention.

It should be noted that, in the foregoing example, the static memory cell 304 is in the half-selected state. Hereafter, referring to FIG. 4, FIG. 4 is a schematic diagram illustrating operations of a half-selected static memory cell in an embodiment of the invention. In FIG. 4, a transistor M41 of the static memory cell 304 is turned off according to the first bit line signal on the first write-in bit line W0BL2, whereas transistors M42 and M43 are turned on respectively according to the second write-in bit line signal on the second write-in bit line W1BL2 and the write-in word line signal on the write-in word line WWL2. Accordingly, the reference voltage VCC served as the operating power may be transmitted to the first and second tristate output inverting circuits through the turned on transistors M42 and M43. In other words, the data latch circuit in the static memory cell 304 may operate normally to maintain its latched data. In addition, the transistor M44 is turned off according to the write-in word line signal on the write-in word line WWL2, whereas the transistor MW24 is also turned off according to the second write-in bit line signal on the second write-in bit line W1BL2. Therefore, a path for providing the reference voltage GND to be written into the data latch circuit is cut off, so that the condition where the write-in data is mistakenly written into the static memory cell 304 will not occur.

In summary, according to the invention, the data write-in circuit selects to supply the reference voltage to one of the tristate output inverting circuits in the data latch circuit during the data write-in time period and turns off the path of another one of the tristate output inverting circuits for receiving the operating power. As a result, the write-in operation of the write-in data can be easily accomplished without suffering any interference. Moreover, with operations of the data write-in circuit, data stored in the non-selected and half-selected static memory cells will not suffer abnormal variation caused by signal interference provided by external signals, so that data correctness of the static memory cell may also be maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static memory cell, comprising:
   a data latch circuit, comprising a first tristate output inverting circuit and a second tristate output inverting circuit, an input terminal of the first tristate output inverting circuit being coupled to an output terminal of the second tristate output inverting circuit, an output terminal of the first tristate output inverting circuit being coupled to an input terminal of the second tristate output inverting circuit;
   a data write-in circuit, coupled to the data latch circuit, providing a first reference voltage to a power receiving terminal of a selected tristate output inverting circuit which is one of the first tristate output inverting circuit and the second tristate output inverting circuit, and providing a second reference voltage to an input terminal of the selected tristate output inverting circuit during a data write-in time period; and
   a data read-out circuit, coupled to the output terminal of the second tristate output inverting circuit, generating read-out data according to a voltage at the output terminal of the second tristate output inverting circuit and the second reference voltage during a data read-out time period.

2. The static memory cell of claim 1, wherein the data write-in circuit comprises:
   a first switch, serially connected between the first reference voltage and a power receiving terminal of the first tristate output inverting circuit, and turned on or off according to a first write-in bit signal;
   a second switch, serially connected between the first reference voltage and a power receiving terminal of the second tristate output inverting circuit, and turned on or off according to a second write-in bit signal;
   a third switch, serially connected between the power receiving terminal of the first tristate output inverting circuit and the power receiving terminal of the second tristate output inverting circuit, and turned on or off according to a write-in word line signal; and
   a fourth switch, having a first terminal receiving the second reference voltage, and determining whether to provide the second reference voltage at a second terminal to the input terminals of the first tristate output inverting circuit and second tristate output inverting circuit according to the write-in word line signal,
   wherein the first write-in bit signal and the second write-in bit signal are complementary during the data write-in time period.

3. The static memory cell of claim 2, wherein the first reference voltage is a power voltage, and the second reference voltage is a ground voltage.

4. The static memory cell of claim 2, wherein the first reference voltage is a ground voltage, and the second reference voltage is a power voltage.

5. The static memory cell of claim 2, wherein the first write-in bit signal and the second write-in bit signal are determined according to a logic level of write-in data.

6. The static memory cell of claim 2, wherein the data latch circuit further comprises:
   a first data write-in switch, coupled between the input terminal of the second tristate output inverting circuit and the second terminal of the fourth switch, and turned on or off according to the first write-in bit signal; and
   a second data write-in switch, coupled between the input terminal of the first tristate output inverting circuit and the second terminal of the fourth switch, and turned on or off according to the second write-in bit signal.

7. The static memory cell of claim 1, wherein the data read-out circuit comprises:
   a first switch, having a first terminal receiving the second reference voltage, the first switch being turned on or off according to the voltage at the output terminal of the second tristate output inverting circuit; and
   a second switch, coupled between a second terminal of the first switch and a read bit line, the second switch being turned on or off according to a read bit line signal and providing the read data to the read bit line.

8. A static memory apparatus, comprising:
   a plurality of first write-in bit lines, transmitting a plurality of first write-in bit signals respectively;
   a plurality of second write-in bit lines, transmitting a plurality of second write-in bit signals respectively;
   a plurality of write-in word lines, transmitting a plurality of write-in word line signals respectively; and
   a plurality of static memory cells, arranged in a memory cell array, the memory cell array having a plurality of static memory cell rows and a plurality of static memory cell columns, the first write-in bit lines and the second write-in bit lines being disposed respectively in correspondence to the static memory cell rows, the write-in word lines being disposed respectively in correspondence to the static memory cell columns, and each of the static memory cells comprising:
   a data latch circuit, comprising a first tristate output inverting circuit and a second tristate output inverting circuit, an input terminal of the first tristate output inverting circuit being coupled to an output terminal of the second tristate output inverting circuit, an output terminal of the first tristate output inverting circuit being coupled to an input terminal of the second tristate output inverting circuit;

a data write-in circuit, coupled to the data latch circuit, and coupled to the corresponding first and second write-in bit lines and the write-in word line, providing a first reference voltage to a power receiving terminal of a selected tristate output inverting circuit which is one of the first tristate output inverting circuit and the second tristate output inverting circuit, and providing a second reference voltage to an input terminal of the selected tristate output inverting circuit during a data write-in time period; and a data read-out circuit, coupled to the output terminal of the second tristate output inverting circuit, generating read-out data according to a voltage at the output terminal of the second tristate output inverting circuit and the second reference voltage during a data read-out time period.

9. The static memory apparatus of claim 8, wherein the data write-in circuit comprises:

a first switch, serially connected between the first reference voltage and a power receiving terminal of the first tristate output inverting circuit, and turned on or off according to the corresponding first write-in bit signal;

a second switch, serially connected between the second reference voltage and a power receiving terminal of the second tristate output inverting circuit, and turned on or off according to the corresponding second write-in bit signal;

a third switch, serially connected between the power receiving terminal of the first tristate output inverting circuit and the power receiving terminal of the second tristate output inverting circuit, and turned on or off according to the corresponding write-in word line signal; and a fourth switch, having a first terminal receiving the second reference voltage, and determining whether to provide the second reference voltage at a second terminal to the input terminals of the first tristate output inverting circuit and second tristate output inverting circuit according to the write-in word line signal, wherein the first write-in bit signal and the second write-in bit signal are complementary during the data write-in time period.

10. The static memory apparatus of claim 8, wherein the first write-in bit signal and the second write-in bit signal corresponding to each of the static memory cells are determined according to a logic level of write-in data.

11. The static memory apparatus of claim 8, wherein the data latch circuit further comprises:

a first data write-in switch, coupled between the input terminal of the second tristate output inverting circuit and the second terminal of the fourth switch, and turned on or off according to the corresponding first write-in bit signal; and a second data write-in switch, coupled between the input terminal of the first tristate output inverting circuit and the second terminal of the fourth switch, and turned on or off according to the corresponding second write-in bit signal.

12. The static memory apparatus of claim 8, wherein the data read-out circuit comprises:

a first switch, having a first terminal receiving the second reference voltage, the first switch being turned on or off according to the voltage at the output terminal of the second tristate output inverting circuit; and a second switch, coupled between a second terminal of the first switch and a read bit line, the second switch being turned on or off according to a read bit line signal and providing the read data to the read bit line.

* * * * *